United States Patent
Tomasi

(10) Patent No.: US 12,241,940 B2
(45) Date of Patent: Mar. 4, 2025

(54) DUMMY ELECTRIC BATTERY CELL, USABLE AS A GAUGE TO VERIFY THE CORRECT OPERATION OF A MEASURING APPARATUS IN AN ELECTRIC BATTERY ASSEMBLY PLANT, AND A METHOD USING THIS DUMMY BATTERY CELL

(71) Applicant: Comau S.p.A., Grugliasco (IT)

(72) Inventor: Daniele Tomasi, Grugliasco (IT)

(73) Assignee: Comau S.p.A., Grugliasco (IT)

( * ) Notice: Subject to any disclaimer, the term of this patent is extended or adjusted under 35 U.S.C. 154(b) by 72 days.

(21) Appl. No.: 17/801,276

(22) PCT Filed: Feb. 22, 2021

(86) PCT No.: PCT/IB2021/051473
§ 371 (c)(1),
(2) Date: Aug. 22, 2022

(87) PCT Pub. No.: WO2021/171162
PCT Pub. Date: Sep. 2, 2021

(65) Prior Publication Data
US 2023/0094898 A1    Mar. 30, 2023

(30) Foreign Application Priority Data
Feb. 24, 2020   (IT) .................... 102020000003787

(51) Int. Cl.
*G01R 31/385*   (2019.01)
*G01R 31/389*   (2019.01)
(Continued)

(52) U.S. Cl.
CPC ....... *G01R 31/3865* (2019.01); *G01R 31/389* (2019.01); *G01R 31/396* (2019.01); *G01R 35/005* (2013.01)

(58) Field of Classification Search
CPC ............... G01R 35/005; G01R 35/007; G01R 31/3644; G01R 31/003; G01R 31/013;
(Continued)

(56) References Cited

U.S. PATENT DOCUMENTS

| 4,322,597 A | 3/1982 | Hooke |
| 8,460,817 B2 | 6/2013 | Rourke et al. |
| 2016/0291080 A1 | 10/2016 | Lu et al. |

FOREIGN PATENT DOCUMENTS

| CN | 208986081 U | 6/2019 |
| JP | 2014071074 A | 4/2014 |

(Continued)

OTHER PUBLICATIONS

English translation of JP 2014071074 obtained from espacenet.com. (Year: 2014).*

(Continued)

*Primary Examiner* — Moshe Wilensky
(74) *Attorney, Agent, or Firm* — Young Basile Hanlon & MacFarlane, P.C.

(57) ABSTRACT

In an electric battery assembly plant, including a battery assembly line having a station that receives battery cells or modules to be assembled together, a measuring apparatus is configured for measuring the electrical resistance and the electrical voltage of a single battery cell or a battery module. The correct operation of the measuring apparatus is verified by arranging at least one dummy battery cell configured and sized to emulate a real battery cell, and having an electrical resistance of a predetermined value and/or including a voltage generator to generate a voltage of a strictly predetermined value at the terminals of the dummy battery cell. The dummy battery cell may then be used as a gauge to check in a simple and rapid way whether the measuring apparatus is operating correctly and reliably.

1 Claim, 3 Drawing Sheets

(51) Int. Cl.
  *G01R 31/396* (2019.01)
  *G01R 35/00* (2006.01)
(58) Field of Classification Search
  CPC ............. G01R 31/3865; G01R 31/389; G01R 31/396; G01R 31/364; G01R 31/3835
  See application file for complete search history.

(56) References Cited

FOREIGN PATENT DOCUMENTS

| | | |
|---|---|---|
| KR | 101697698 B1 | 1/2017 |
| KR | 102015898 B1 | 8/2019 |
| WO | 2021152344 A1 | 8/2021 |

OTHER PUBLICATIONS

U.S. Appl. No. 17/795,126, filed Jul. 25, 2022, entitled "Method Of Monitoring The Quality Of A Weld Bead, Related Welding Station And Computer-Program Product".

* cited by examiner

DUMMY ELECTRIC BATTERY CELL, USABLE AS A GAUGE TO VERIFY THE CORRECT OPERATION OF A MEASURING APPARATUS IN AN ELECTRIC BATTERY ASSEMBLY PLANT, AND A METHOD USING THIS DUMMY BATTERY CELL

CROSS-REFERENCE TO RELATED APPLICATION(S)

This application is filed pursuant to 35 U.S.C. § 371 claiming priority benefit to PCT/IB2021/051473 filed Feb. 22, 2021, which claims priority to Italian Patent Application No. 102020000003787 filed Feb. 24, 2020, the contents of both applications incorporated herein by reference in their entirety for all purposes.

TECHNICAL FIELD

The present invention relates to electric batteries and, in particular, to methods and systems for assembling these batteries.

BACKGROUND

In an assembly plant for electric batteries, an assembly line is typically provided including a station that receives battery cells or modules to be assembled together, with which a measuring apparatus is associated, for measuring the electrical resistance of a battery cell or battery module and of the open circuit voltage (OCV) supplied by a battery cell or battery module. The measuring apparatus can be arranged to check, continuously or with a determined periodicity, that the battery cells received in the assembly plant correspond to the nominal values prescribed for their inner electrical resistance and for the electrical voltage at the ends of the battery cell.

In assembly plants of the type described above, it is also necessary to check the correct operation of the aforesaid measuring apparatus with a determined periodicity. Currently, this verification would involve the transfer of the measuring apparatus to a specialized laboratory, and a consequent interruption in the production cycle, even only for replacing the measuring apparatus and/or a temporary interruption in the verification procedure.

SUMMARY

Therefore, one object of the present invention is to overcome the drawbacks explained above, by providing a method and a system for controlling the quality of battery cells or battery modules used in a battery assembly plant, wherein the correct operation of the aforesaid measuring apparatus can be checked quickly and easily, without the need to remove the measuring apparatus from the assembly plant.

Another object of the invention is to allow carrying out the aforesaid verification of the correct operation of the measuring apparatus in an extremely precise and reliable way.

With a view to achieving the aforesaid object, the present invention relates to a method for the quality control of electric battery cells or modules in a plant for assembling electric batteries,
wherein said plant comprises a battery assembly line, including a station that receives battery cells or modules to be assembled together, with which a measuring apparatus is associated, for measuring the electrical resistance of a battery cell and/or the electrical voltage supplied by a battery cell,
wherein said measuring apparatus is configured and sized to receive a battery cell and is provided with terminals configured and arranged to enter into electrical connection with the terminals of a battery cell when the battery cell is received on said measuring device,
said method being characterized in that the correct functionality of said measuring apparatus is verified by arranging a dummy battery cell in the measuring apparatus, the dummy battery cell having a structure configured and sized to be received within the measuring apparatus and having electrical terminals configured and sized to enter into electrical connection with the terminals of the measuring apparatus when the dummy battery cell is received in the measuring apparatus, and
in that said dummy battery cell has an electrical resistance between its terminals having a strictly predetermined value and/or includes a voltage generator configured to produce a voltage of strictly predetermined value at the terminals of said dummy battery cell,
so that the correct functionality of the measuring apparatus is verified by checking that the resistance and/or voltage measured by the measuring apparatus, when said dummy battery cell is received therein, correspond to said predetermined values, within a given tolerance margin.

In a first embodiment, the method according to the invention envisages that the following are arranged:
a first dummy battery cell having an electrical resistance between its terminals of strictly predetermined value, and
a second dummy battery cell including a voltage generator configured to produce a voltage of strictly predetermined value at the terminals of said second dummy battery cell,
so that the correct functionality of the measuring apparatus is verified by checking that the resistance and voltage measured by the measuring apparatus, when said first and second dummy battery cells are arranged therein, correspond to said predetermined values, within a given tolerance margin.

In the case of this first embodiment, two first dummy battery cells are preferably provided, which differ from each other by the value of their electrical resistance, the two electrical resistance values of said two first dummy battery cells being: one within the range of acceptability for the electrical resistance of each battery cell, and the other above said range of acceptability, and in that said measuring apparatus is verified by arranging therein, in successive steps, each of the first two dummy battery cells and the second dummy battery cell.

In a second embodiment, the method according to the invention envisages that a single dummy battery cell is provided, including a first electric circuit and a second electric circuit, with respective terminals separated from each other, the two electric circuits being preferably arranged on two opposite sides of the dummy cell,
wherein said first electric circuit includes an electric resistance between its terminals of strictly predetermined value, and
wherein said second electric circuit includes a voltage generator configured to produce a voltage of strictly predetermined value at the terminals of said second electric circuit, so that the correct functionality of the measuring apparatus is verified by checking that the resistance and voltage measured by the measuring apparatus, when it is connected, respectively, to said first electric circuit and to said second electric circuit of said dummy battery cell, correspond to said predetermined values, within a given tolerance margin.

The invention also relates to the system for implementing the aforesaid method.

Finally, the invention is also directed at the dummy cell taken on its own, usable in the method described above and characterized in that it comprises:

a support structure configured and sized so as to emulate the configuration and dimensions of a real battery cell, two electric terminals, mounted on said support structure and configured, sized and arranged to emulate the electric terminals of a real battery cell, an electrical circuit for connecting together said terminals, which includes an electrical resistance of strictly predetermined value, or a voltage generator, which can be activated to apply a voltage of strictly predetermined value to said terminals.

As indicated above, a solution is also provided wherein a single dummy cell carries, preferably on its two opposite faces, both the circuit with the resistance of predetermined value, and the circuit with the voltage generator that generates a voltage of predetermined value.

Of course, the invention is equally applicable not only to battery cells, but also to entire battery modules consisting of several battery cells assembled together. In this case, the provided measuring apparatus is intended to test an entire battery module, and the method and the system according to the invention envisage arranging dummy battery modules, instead of dummy cells.

As is evident from above, the invention is mainly based on the idea of providing a dummy battery cell that can be used as a gauge to quickly and accurately check the correct operation of the measuring apparatus of the electrical resistance and voltage of the battery cells in a battery assembly plant.

BRIEF DESCRIPTION OF THE DRAWINGS

Further characteristics and advantages of the present invention will become apparent from the description that follows with reference to the attached drawings, provided purely by way of non-limiting example, wherein.

DETAILED DESCRIPTION

Figure 1:
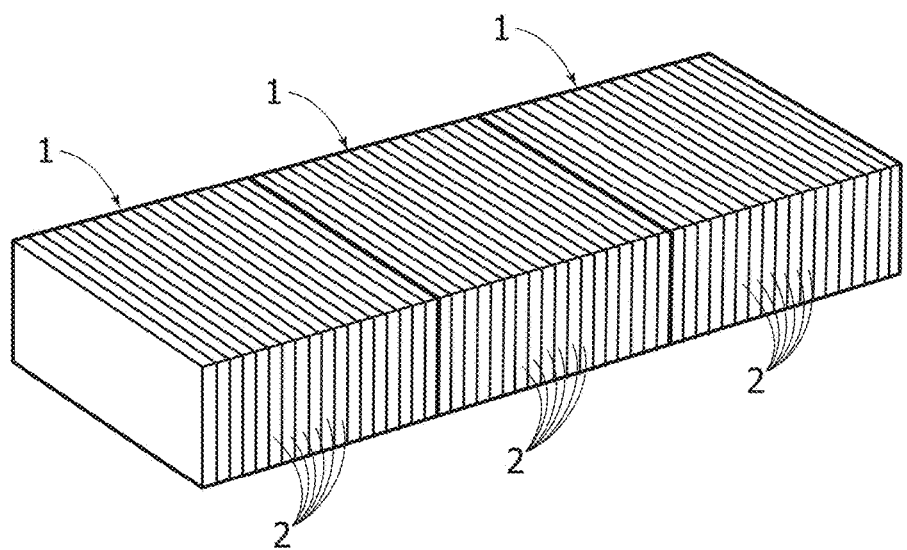
FIG. 1 is a schematic perspective view illustrating a battery pack for an electric traction vehicle, consisting of a plurality of battery modules, each module—in turn—consisting of a plurality of side-by-side battery cells.

FIG. 1 of the attached drawings shows in an extremely schematic way the main part constituting a battery pack, in the example a battery pack for an electric traction vehicle. FIG. 1 does not show the battery pack casing or all the devices that are normally associated therewith, including the devices for thermal conditioning of the battery pack. The Figure instead shows only the essential components which, in the example, include three side-by-side battery modules 1, each consisting of a plurality of battery cells 2 of the so-called "pouch" type, which is illustrated in perspective view and on an enlarged scale in FIG. 2.

Again, FIG. 1 does not show the construction details of the battery pack including, among other things, sheets (for example of aluminum) interposed between battery cells or between groups of battery cells, as well as the conductive bars that connect the terminals of the various cells.

Figure 2:
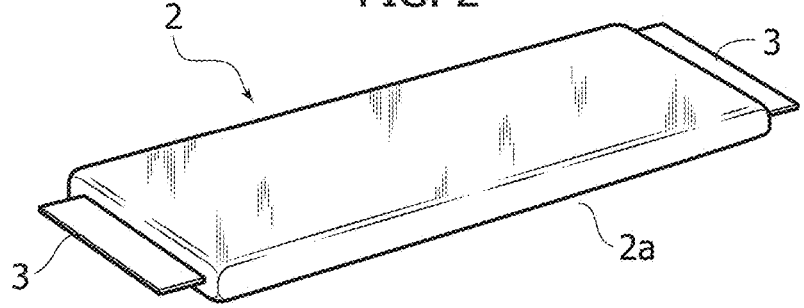
FIG. 2 is a perspective view on an enlarged scale of a single battery cell, of the so-called "pouch" type used in the example of FIG. 1.

FIG. 2 is a perspective view of a battery cell of the "pouch" type typically having an elongated and flattened configuration, with a casing 2a, for example, of aluminum, which hermetically wraps the parts making up the cell 2, and a pair of electrical terminals 3. In the illustrated example, the electrical terminals 3 are provided at the two opposite ends of the cell 2, but battery cells can also be used that provide both terminals at the same end of the cell.

It should also be noted that although the attached drawings show an example of application of the invention with reference to battery cells of the "pouch" type, the disclosures of the present invention are immediately applicable to battery cells or modules of any known type, for example, also to battery cells having a cylindrical configuration.

Figure 3:
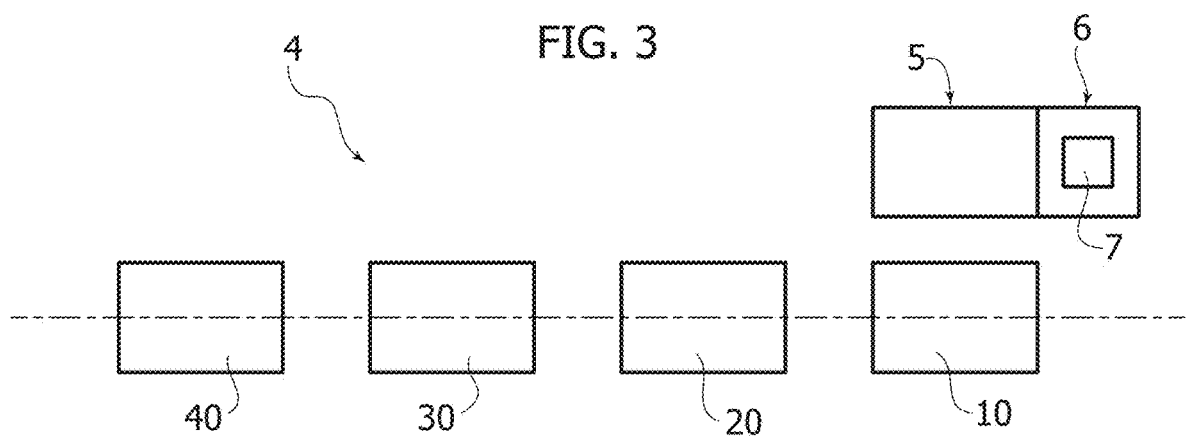
FIG. 3 is a schematic plan view of an assembly plant for motor-vehicle batteries.

FIG. 3 of the attached drawings is a schematic plan view of a plant 4 for assembling battery packs. The plant 4 includes an assembly line including a plurality of stations 10, 20, 30, 40 through which an assembly line of the battery pack extends. A station 5 is arranged adjacent to an initial station 10 of the plant 4, which receives battery cells or modules to be assembled together. The station 5 is associated with a structure 6 carrying an apparatus 7 for measuring the resistance and the open circuit voltage (OCV) of the battery cells arriving at the station 5 to be assembled in the plant 4. The measuring apparatus 7 can be used continuously or with any desired periodicity to check the quality of the battery cells which are assembled.

Figure 4:
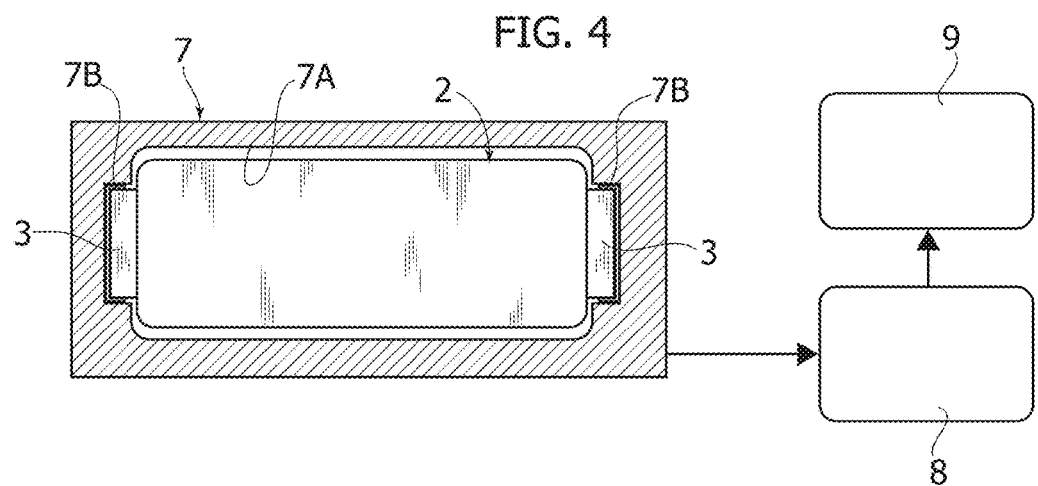
FIG. 4 is a schematic view of a measuring apparatus used in the plant of FIG. 3.

FIG. 4 is a schematic view of the measuring apparatus 7. The construction details of this apparatus are not described here, both because this measuring apparatus can be of any known commercially available type and because elimination of these details makes the drawings more ready and easy to understand, and in that the aforesaid manufacturing details of the measuring apparatus, taken on their own, do not form the subject of the present invention.

What is important to note is that the measuring apparatus 7 is arranged with a seat 7A intended to receive a battery cell 2 for checking its electrical resistance and electrical voltage characteristics. FIG. 4 shows a battery cell 2 received within the seat 7A of the measuring apparatus 7. The seat 7A is configured and sized in such a way as to be able to accommodate the battery cell 2, and has electrical terminals 7B at the two opposite ends of the seat intended to enter into electrical connection with the terminals 3 of the battery cell 2 when this is received within the location of the measuring apparatus 7. The measuring apparatus 7 is arranged, in a per se known manner, with an electrical measuring circuit, which is capable of sending a signal to an electronic board 8, which is part of the measuring apparatus 7 that processes this signal, to record and display the measured values of electrical resistance and voltage on a display 9. As already indicated, the aforesaid characteristics of the measuring apparatus are described here in a purely schematic way solely for the object of facilitating the understanding of the present invention, being evident that in practice, the conformation of the measuring apparatus 7, per se known, may widely vary with respect to what is described with reference to FIG. 4.

As has already been illustrated above, the measuring apparatus 7 allows quality control of the battery cells that arrive at the station 5 to be assembled in the plant 4, but there is the problem of periodically checking the correct operation of the measuring apparatus.

In order to be able to carry out this check in a simple and rapid way, without removing the measuring apparatus 7 from the assembly plant, the invention proposes providing one or more dummy battery cells, to be used as gauges to check the correct operation of the measuring equipment 7.

Figure 5:
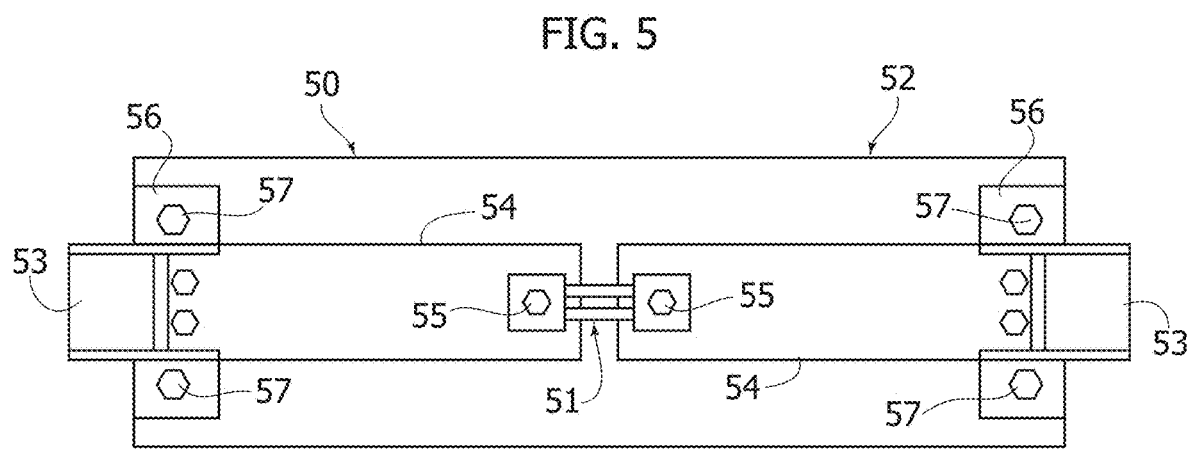
FIGS. 5, 6 are schematic plan views of two different types of dummy battery cells used in the system and method according to the invention.
Figure 6:
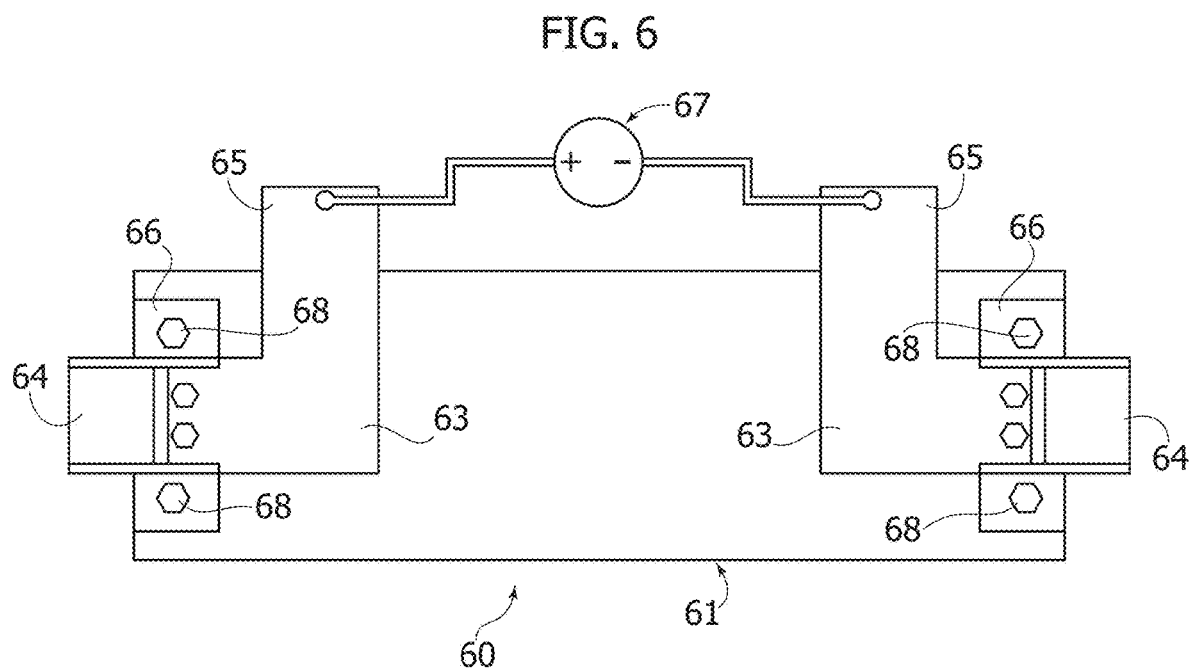

In a first embodiment, at least two different types of dummy cells are provided, of which FIGS. 5, 6 show two examples, intended to be used to check the correct operation of the measuring apparatus, respectively, with reference to the resistance measurement and voltage measurement.

The aforesaid dummy battery cells are configured and sized to emulate the shape and dimensions of a real battery cell 2, so that they can be received in the seat 7A of the measuring apparatus 7. A first type of dummy cell, illustrated in FIG. 5, is arranged in such a way as to present an electrical resistance of a strictly predetermined value. A second type of dummy cell, illustrated in FIG. 6, is provided with a voltage generator which, when activated, produces an electrical voltage of a strictly predetermined value at the terminals of the dummy cell. In this way, each dummy cell may be used as a gauge, placing it in the seat 7A of the measuring apparatus 7, and verifying that the values measured by the apparatus correspond to the known values of the resistance and voltage of the dummy cells, within a margin of predetermined tolerance.

Therefore, verifying the correct operation of the measuring apparatus can be carried out very quickly and in a very simple way, without the need to remove the measuring apparatus from the assembly plant and without causing any interruption or slowing-down compared to the normal productive cycle.

With reference to FIG. 5, the reference number 50 indicates—in its entirety—a dummy battery cell arranged with a resistor 51 having a strictly predetermined electrical resistance value. The dummy battery cell 50 comprises a support structure 52 of an electrically non-conductive material, for example, plastic material, with a configuration and general dimensions corresponding to the configuration and dimensions of a single battery cell 2. The support structure 52, therefore, has a relatively elongated and flattened structure, with opposite ends from which electrical terminals 53 protrude. The terminals 53 consist of the ends of metal sheets 54 secured on the upper surface of the support structure 52 in any known way (for example, by means of screws), and terminating at a short distance from each other at the center of the support structure 52. The opposite ends of the resistor 51 are fixed over the adjacent ends of the two sheets 54 by means of screws 55. In the case of the illustrated example, the resistor 51 has a body with two end plates joined together by two cylindrical bars. However, this configuration is provided here purely by way of example. The opposite ends of the sheets 54 rest on the support structure 52 with the interposition of auxiliary support structures 56 fixed to the support structure 52 by screws 57. All of the aforesaid construction details are, of course, given here purely by way of example.

In the case of the aforesaid first embodiment of the invention, which provides a first dummy cell for checking the resistance measurement, and a second dummy cell for checking the voltage measurement, two types of first dummy cells 50 are preferably arranged of the type illustrated in FIG. 5, having two different strictly predetermined values of their electrical resistance. The first strictly predetermined value is chosen within the range of acceptability for the electrical resistance of the battery cells to be assembled in the plant 4. The second value is chosen above the aforesaid acceptability range.

Therefore, when it is necessary to verify the correct operation of the measuring apparatus 7 with reference to the measurement of the electrical resistance of the battery cells, the two dummy cells 50 having the two different strictly predetermined values of the electrical resistance are arranged, in successive steps within the seat 7A of the measuring apparatus 7. This procedure is chosen to make the verification of the correct operation of the measuring apparatus more reliable, taking into account the fact that the order of magnitude of the electrical resistance of a battery cell is very small, in the order of a few milli-ohm (for example 6 mΩ).

With reference to FIG. 6, the number 60 indicates—in its entirety—a dummy battery cell that can be used to verify the correct operation of the measuring apparatus 7 with reference to the measurement of the open circuit voltage (OCV) of the battery cells. To this end, the dummy battery cell 60 comprises a support structure 61, which, as in the case of the example of FIG. 5, is configured and sized in order to emulate the configuration and dimensions of a battery cell 2. The support structure 61 also, therefore, has a substantially flattened and elongated body and is constituted by an electrically non-conducting material, for example, plastic material. Similarly to what is illustrated with reference to FIG. 5, also in the case of the dummy cell 60 two metal sheets 63 are secured above the support structure 61 (which in this example have a square configuration), each having a first end 64 and a second end 65. The first ends 64 of the two sheets 63 define opposite electrical terminals of the dummy cell 60, intended to emulate the opposite terminals of a real battery cell. Also in this case, additional supports of plastic material 66 are associated with the first ends 64 of the sheets 63, fixed by means of screws 68 to the support structure 61.

The opposite ends of a voltage generator 67 (schematically illustrated in FIG. 6) are connected to the second ends 65 of the sheets 63, which can be activated to generate an open circuit voltage (OCV) of strictly predetermined value at the terminals 64.

The construction details of the voltage generator 67 are not described or illustrated here, since this generator can be of any known type available on the market, and since it does not fall, taken alone, within the scope of the present invention.

When it is necessary to verify the correct operation of the measuring apparatus 7 with reference to the measurement of the open circuit voltage (OCV) of the battery cells, the dummy battery cell 60 is placed in the seat 7A of the measuring apparatus 7, and the generator 67 is activated to generate a voltage of a strictly predetermined value at the terminals of the dummy cell. It is thus possible to check whether the value measured by the apparatus 7 corresponds to the actual value of the voltage associated with the dummy cell 60.

Figure 7A:
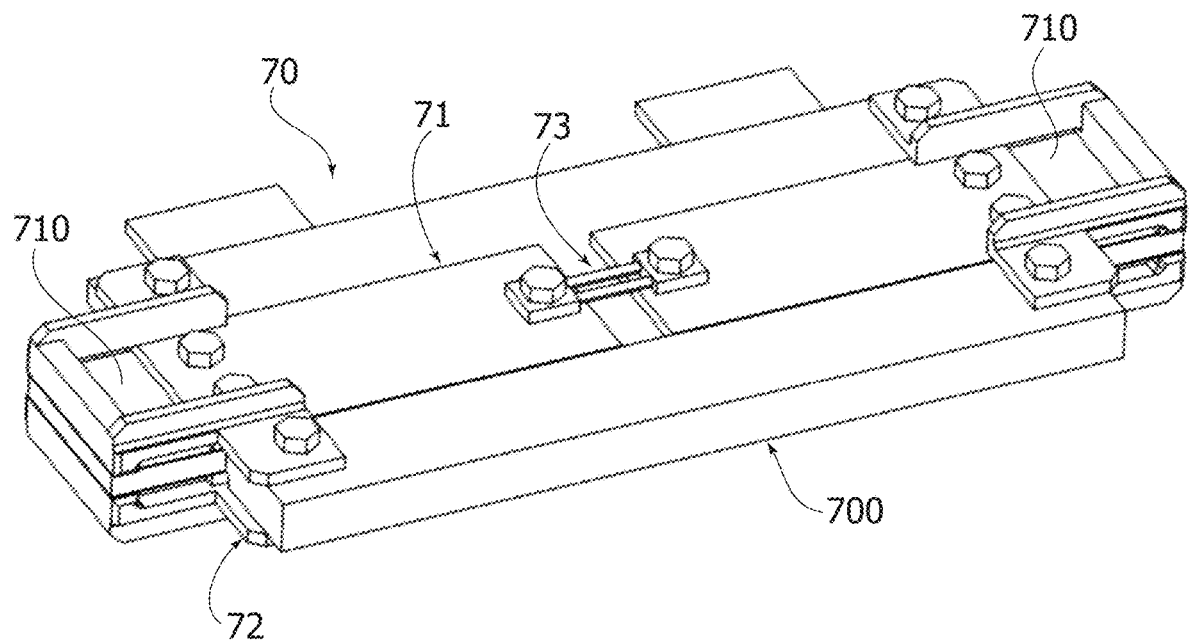
FIGS. 7A, 7B are two perspective views of a variant of the dummy cell, which comprises on its two opposite faces both the first electrical circuit with the resistance of a predetermined value, and the second electrical circuit with the voltage generator to generate a voltage of predetermined value.
Figure 7B:
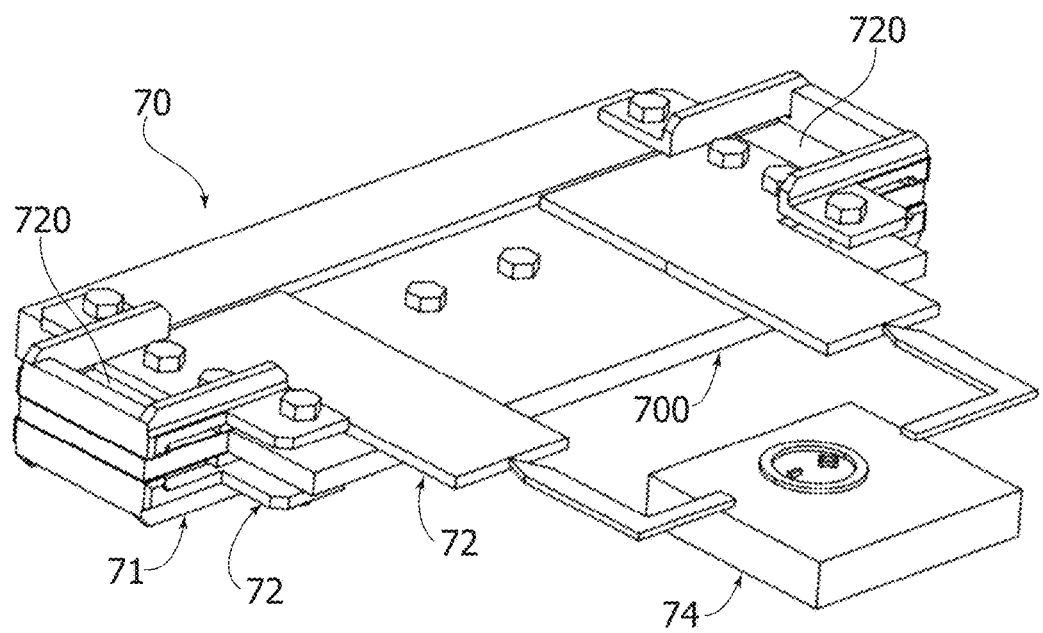

A second embodiment of the invention envisages the provision of a single dummy cell (of which FIGS. 7A, 7B show a non-limiting example) including, preferably on its two opposite faces, both a first electrical circuit comprising a resistor of a strictly predetermined value, and a second electrical circuit with a voltage generator configured to generate a voltage of a strictly predetermined value. FIGS. 7A, 7B show the two opposite faces of the same dummy cell 70. The dummy cell 70 has a support structure 700 of an electrically-insulating plastic material, on the two opposite faces a first electric circuit 71, with a resistance 73 of a strictly predetermined value, and a second electric circuit 72, with which the voltage generator 74 is associated, are arranged, configured to generate an electrical voltage of a strictly predetermined value. The two circuits 71, 72 have respective electrical terminals 710, 720, which are separated and insulated from each other, being arranged on the opposite faces of the support structure 700 of insulating material. The dummy cell 70 is arranged oriented as in FIG. 7A or as in FIG. 7B above the measuring apparatus, depending on whether this apparatus is required for testing with reference to the resistance measurement or voltage measurement.

As is evident from the above description, the idea underlying the present invention is that of providing at least one dummy battery cell, having configuration and dimensions that emulate the configuration and dimensions of a real battery cell, and which can be used as a gauge to check the correct operation of a device for measuring the resistance and/or voltage of the battery cells, since a rigorously pre-determined and known resistance value and/or voltage value is associated with this dummy cell.

Of course, without prejudice to the principle of the invention, the details of construction and the embodiments may vary widely with respect to those described and illustrated purely by way of example, without departing from the scope of the present invention, as defined by the attached claims.

The invention claimed is:

1. A method for the quality control of electric battery cells or modules for use in a plant for assembling electric batteries, the method comprising:

providing a battery assembly line including a station for receiving a battery cell or a battery module to be assembled together;

measuring by a measuring apparatus associated with the station at least one of an electrical resistance of the battery cell or the battery module or an electrical voltage supplied by the battery cell or the battery module, wherein said measuring apparatus is configured and sized to receive the battery cell or the battery module, and is provided with electrical terminals configured and arranged to enter into electrical connection with terminals of the battery cell or the battery module when the battery cell or the battery module is received on said measuring apparatus; and verifying a correct functionality of said measuring apparatus by positioning a dummy battery cell in the measuring apparatus, the dummy battery cell having a structure configured and sized to be received within the measuring apparatus and having electrical terminals configured and sized to enter into electrical connection with the electrical terminals of the measuring apparatus when the dummy battery cell is received in the measuring apparatus, wherein said dummy battery cell further comprises:
a first electric circuit and a second electric circuit each having respective electrical terminals separated from each other,
wherein said first electric circuit includes an electric resistance between the electrical terminals of a strictly predetermined value, and
wherein said second electric circuit includes a voltage generator configured to produce a voltage of a strictly predetermined value at the electrical terminals of said second electric circuit, and wherein the correct functionality of the measuring apparatus is verified by checking that the electrical resistance and the voltage measured by the measuring apparatus, when the measuring apparatus is connected, respectively, to said first electric circuit and to said second electric circuit of said dummy battery cell, correspond to said respective strictly predetermined values, within a predetermined tolerance margin.

\* \* \* \* \*